(12) United States Patent
Hasegawa

(10) Patent No.: US 6,696,743 B1
(45) Date of Patent: Feb. 24, 2004

(54) SEMICONDUCTOR TRANSISTOR HAVING GATE ELECTRODE AND/OR GATE WIRING

(75) Inventor: Masahiro Hasegawa, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 228 days.

(21) Appl. No.: 09/597,581

(22) Filed: Jun. 20, 2000

(30) Foreign Application Priority Data

Sep. 29, 1999 (JP) ............................................ 11-276820

(51) Int. Cl.⁷ .............................................. H01L 29/00
(52) U.S. Cl. ...................... 257/513; 257/510; 257/514; 257/515; 257/619; 257/623
(58) Field of Search ......................... 257/510, 513–515, 257/619, 623

(56) References Cited

U.S. PATENT DOCUMENTS

| | | | | |
|---|---|---|---|---|
| 5,933,748 A | * | 8/1999 | Chou et al. ................. | 438/431 |
| 6,022,781 A | * | 2/2000 | Noble et al. ................ | 438/296 |
| 6,084,276 A | * | 7/2000 | Gambino et al. ........... | 257/397 |
| 6,222,225 B1 | * | 4/2001 | Nakamura et al. .......... | 257/315 |
| 6,261,920 B1 | * | 7/2001 | Oyamatsu .................. | 438/424 |
| 6,265,777 B1 | * | 7/2001 | Kobayashi .................. | 257/757 |
| 6,342,715 B1 | * | 1/2002 | Shimizu et al. ............. | 257/314 |
| 6,475,865 B1 | * | 11/2002 | Yang et al. ................. | 438/270 |
| 6,492,672 B1 | * | 12/2002 | Segawa et al. ............. | 257/296 |
| 2003/0107088 A1 | * | 6/2003 | Inumiya et al. ............. | 257/368 |

FOREIGN PATENT DOCUMENTS

| | | | | |
|---|---|---|---|---|
| JP | 7-14916 | 1/1995 | | |
| JP | 9-283613 | 10/1997 | | |
| JP | 2002231804 A | * | 8/2002 | ........... H01L/21/76 |

* cited by examiner

*Primary Examiner*—Tom Thomas
*Assistant Examiner*—José R. Diaz
(74) *Attorney, Agent, or Firm*—Nixon & Vanderhye P.C.

(57) ABSTRACT

A semiconductor transistor formed between trench device isolation regions comprises; a gate electrode formed on a device formation region with the intervention of a gate insulating film and extended over the trench device isolation regions, a distance from an interface between the gate electrode and the gate insulating film to the surface of the device formation region and a distance from said interface to the trench device isolation region being the same, and a gate electrode wiring formed in self-alignment with the gate electrode to have the same length as the length of the gate electrode and connected on the gate electrode on the device formation region.

4 Claims, 6 Drawing Sheets

Fig. 10 (a) (Prior Art)
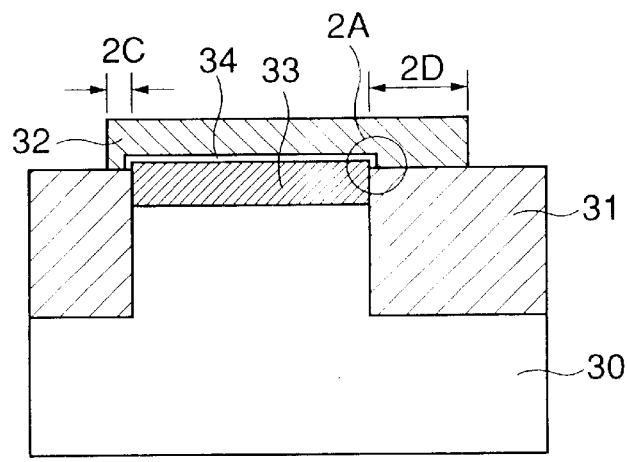
Fig. 10 (b) (Prior Art)
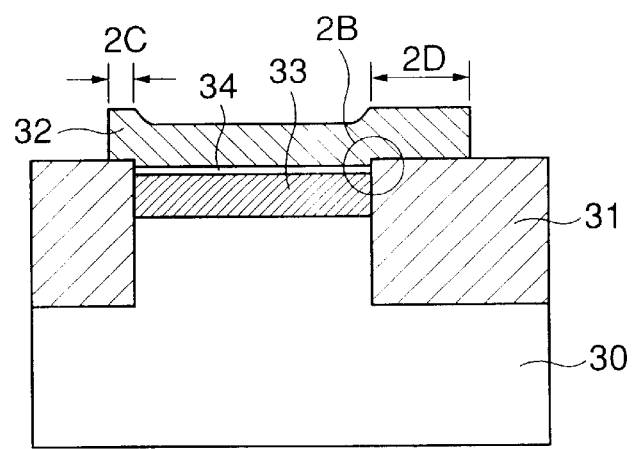
Fig. 11 (Prior Art)
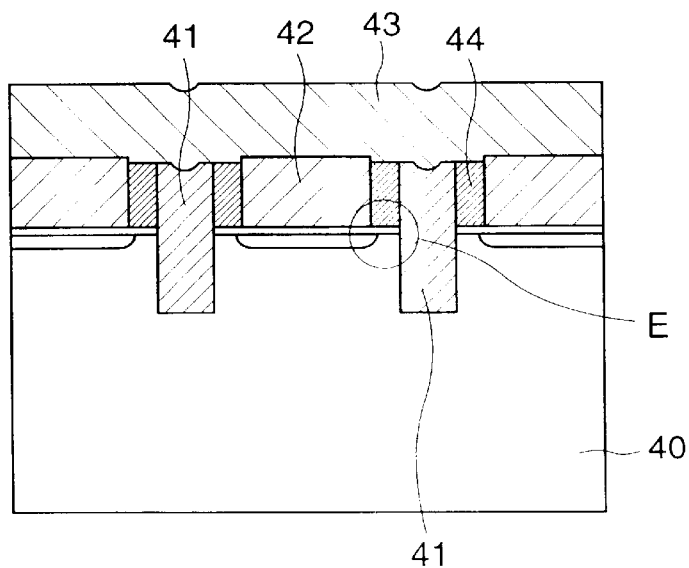

Fig. 12 (a) (Prior Art)
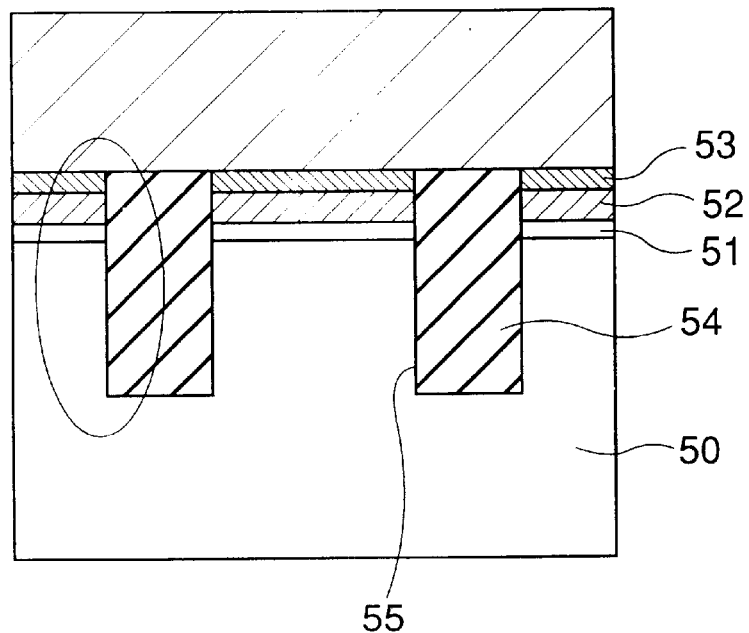
Fig. 12 (b) (Prior Art)
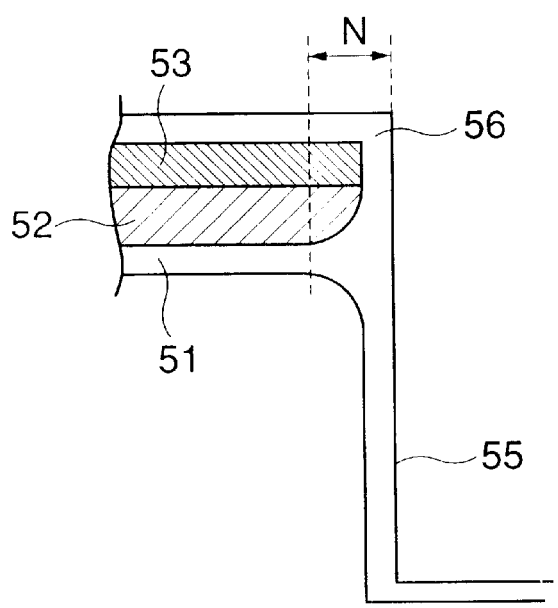

SEMICONDUCTOR TRANSISTOR HAVING GATE ELECTRODE AND/OR GATE WIRING

CROSS-REFERENCE TO RELATED APPLICATION

This application is related to Japanese application No. HEI 11(1999)-276820 filed on Sep. 29, 1999, whose priority is claimed under 35 USC §119, the disclosure of which is incorporated by reference in its entirety.

BACKGROUND OF THE INVENTION

1. Field of the Invention

The present invention relates to a semiconductor transistor and a process of manufacturing the same. More particularly, it relates to a trench-isolated semiconductor transistor and a process of manufacturing the same.

2. Description of Related Art

A semiconductor device as shown in FIGS. 10(*a*) and 10(*b*) has been proposed. In the semiconductor device, trench device isolation regions 31 are formed in a semiconductor substrate 30 and a MOS field effect transistor is formed between the trench device isolation regions 31.

Typically, in such a transistor, a gate electrode 32 is formed on a device formation region 33 defined by the trench device isolation regions 31 and extends over the trench device isolation regions 31 (2C and 2D in FIGS. 10(*a*) and 10(*b*)).

The surface of the trench device isolation region 31 may be positioned lower as shown in FIG. 10(*a*) or higher as shown in FIG. 10(*b*) than the surface of the device formation region 33 in accordance with variation in thickness of an insulating film occurring at the formation and etching of the insulating film, for example.

Where the surface of the trench device isolation region 31 is lower than the surface of the device formation region 33 as shown in FIG. 10(*a*), a gate insulating film 34 is formed on the sides of the device formation region 33 (2A in FIG. 10(*a*)) and a gate electrode 32 is formed thereon. In such a region, the gate insulating film 34 becomes thin because of changes in crystal orientation, stress during oxidization and the like. The thin gate insulating film 34 is liable to be stressed due to an electric field intensified in the operation of device, and thus the gate insulating film 34 may become less reliable.

Also in the case where the surface of the trench device isolation region 31 is higher than the surface of the device formation region 33 as shown in FIG. 10(*b*), the width of the resulting gate electrode 32 varies because of the malalignment of both surfaces, which may seriously deteriorate transistor characteristics.

As shown in FIG. 11, Japanese Unexamined Patent Publication No. HEI 7(1995)-14916 proposes a semiconductor structure in which a gate electrode 42 is formed with a predetermined distance from trench device isolation regions 41 formed in a semiconductor substrate 40, and an insulating film 44 is provided between the gate electrode 42 and the trench device isolation region 41.

In this semiconductor device, a gate electrode wiring 43 is connected on the gate electrode 42. Therefore, as the gate electrode 42 becomes thin according to the miniaturization of the semiconductor structure, a region (E in FIG. 11 (*a*)) between the gate electrode 42 and the trench device isolation region 41 is reversed under the influence of an electric field of the gate electrode wiring 43. This might induce erroneous operation of the transistor.

In order to prevent the reversal, a channel stopper is formed by introducing impurities between the gate electrode 42 and the trench device isolation region 41. In this method, the impurities for the channel stopper enters below the gate electrode 42 and the threshold voltage increases in a region where the channel width of the transistor could be small, that is, a so-called narrow channel effect occurs.

Further, as shown in FIG. 12(*a*), Japanese Unexamined Patent Publication No. HEI 9(1997)-283613 describes planarization of a semiconductor structure, in which i) a gate insulating film 51, a first gate electrode 52 and a second gate electrode 53 are formed in this order on a semiconductor substrate 50, ii) the second gate electrode 53, the first gate electrode 52, the gate insulating film 51 and the semiconductor substrate 50 are sequentially etched using the same mask pattern to form a trench 55 in the semiconductor substrate 50, iii) an insulating film 54 is buried in the trench 55 and iv) the surface of the device is flattened by CMP method.

In this method, however, the semiconductor substrate 50 in which the trench 55 is formed may be damaged, and thereby a leak current might occur.

To solve this drawback, typically, an oxide film 56 is formed on the walls of the trench 55 after the trench 55 is formed in the semiconductor substrate 50.

However, when the walls of the trench 55 thus constructed is oxidized, not only the walls of the trench 55 but also the sides of the gate insulating film 51 formed therealong are oxidized as shown in FIG. 12(*b*), which forms a region called a gate bird's beak (N in FIG. 12(*b*)). This causes the narrow channel effect.

SUMMARY OF THE INVENTION

The present invention is achieved in view of these drawbacks of the prior art and intended to provide a semiconductor transistor and a process of manufacturing the same, which lead to accurate formation of the gate electrode and good reliability of the gate insulating film and prevent leak current in the transistor due to a decrease in the threshold voltage as well as the narrow channel effect.

The present invention provides a semiconductor transistor formed between trench device isolation regions comprising;
a gate insulating film formed on a semiconductor substrate,
a gate electrode formed on a device formation region of the semiconductor substrate with the intervention of the gate insulating film and extended over the trench device isolation regions, a distance from an interface between the gate electrode and the gate insulating film to the surface of the device formation region and a distance from said interface to the trench device isolation region being the same, and
a gate electrode wiring formed in self-alignment with the gate electrode to have the same length as the length of the gate electrode and connected on the gate electrode on the device formation region.

Further, the present invention provides a process of manufacturing a semiconductor transistor comprising the steps of:

(i) forming a gate insulating film, a first conductive film, a first oxide film and a resist pattern for forming a trench device isolation region on a semiconductor substrate;

(ii) etching the first oxide film, the first conductive film and the gate insulating film using the resist pattern as a mask;

(iii) forming an oxidization protective film on the sides of the first oxide film, the first conductive film and the gate insulating film;

(iv) forming a trench in the semiconductor substrate using the first oxide film and the oxidization protective film as a mask, oxidizing the inside walls of the trench to form a second oxide film and removing the oxidization protective film;

(v) forming an insulating film on the entire surface of the semiconductor substrate including the trench;

(vi) removing the insulating film and the second oxide film until the first conductive film is exposed;

(vii) forming a second conductive film and a resist pattern for a gate electrode/a gate electrode wiring on the first conductive film; and (viii) patterning the first and second conductive films using the resist pattern as a mask to form a gate electrode and a gate electrode wiring in self-alignment.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 2(a) to 9(a) are schematic sectional views of a major part, respectively, for illustrating an example of a process for manufacturing the semiconductor transistor according to the present invention;

FIGS. 2(b) and 9(b) are plan views of a major part corresponding to FIGS. 2(a) to 9(a), respectively;

FIGS. 10(a) and 10(b) are a schematic sectional view and a plan view of a major part, respectively, for illustrating an example of a semiconductor transistor according to the prior art;

FIG. 11 is a schematic sectional view of a major part for illustrating another example of a semiconductor transistor according to the prior art; and FIGS. 12(a) and 12(b) are a schematic sectional view and an enlarged view of a major part, respectively, for illustrating still another example of a semiconductor transistor according to the prior art.

DESCRIPTION OF THE PREFERRED EMBODIMENTS

Figure 1:
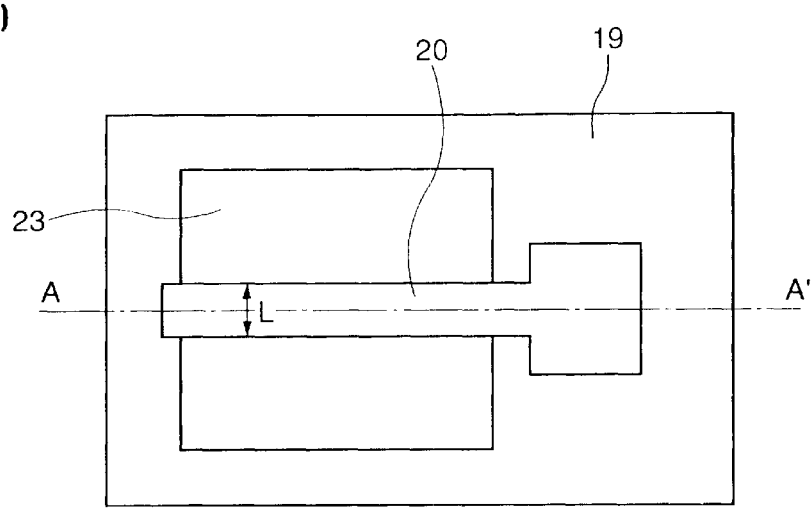
FIGS. 1(a) to 1(c) are a plan view, a schematic sectional view and an enlarged view of a major part, respectively, for illustrating an example of a semiconductor transistor according to the present invention.
Figure 1:
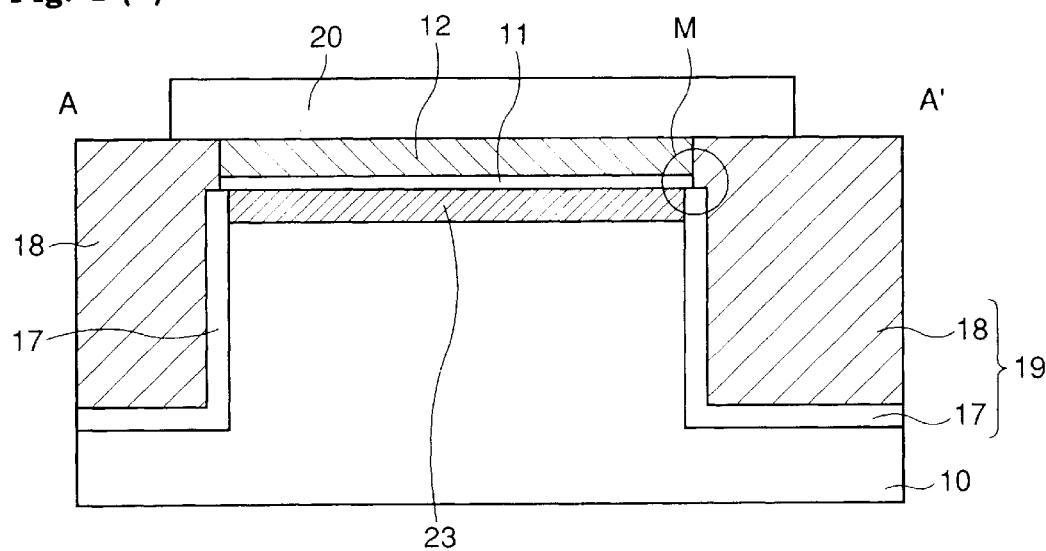
Figure 1:
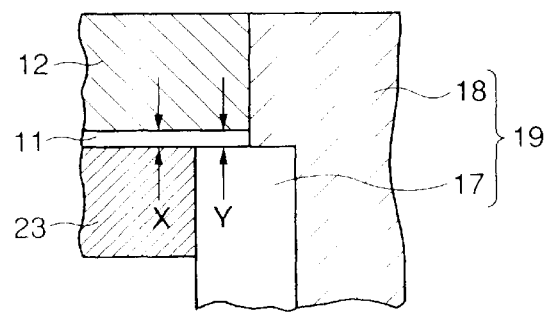
Figure 2:
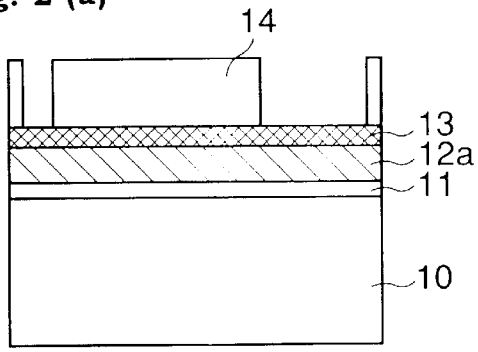
Figure 2:
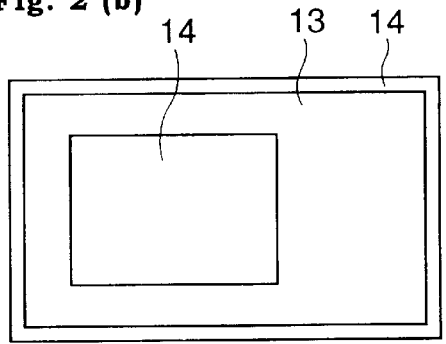
Figure 3:
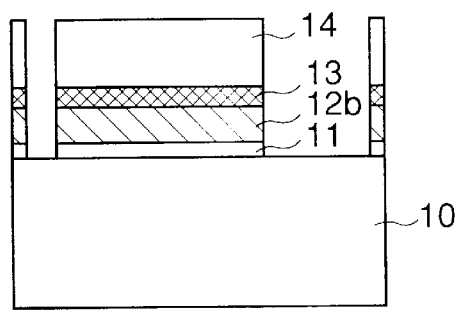
Figure 3:
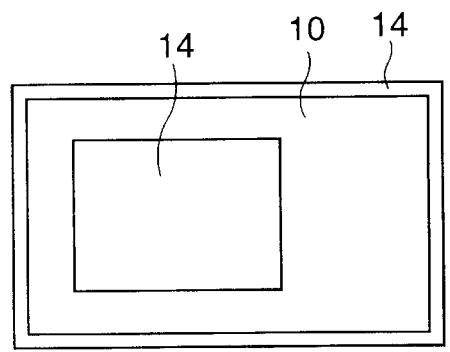
Figure 4:
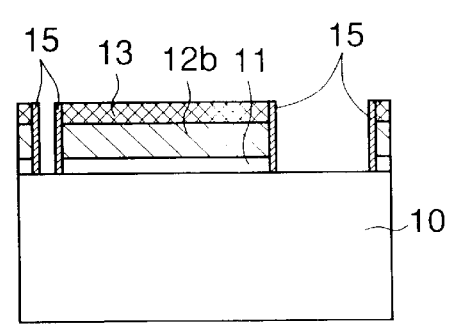
Figure 4:
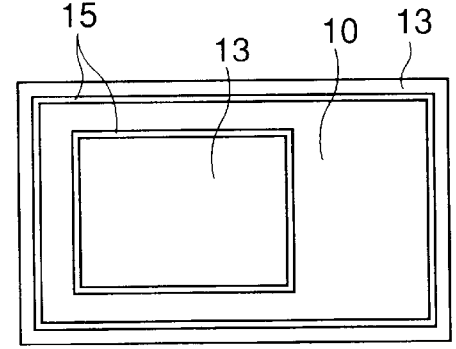
Figure 5:
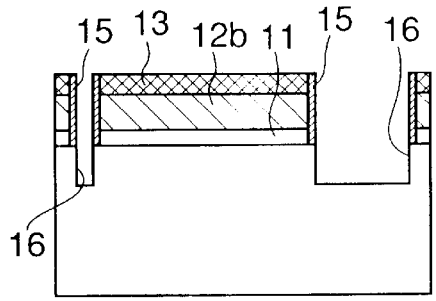
Figure 5:
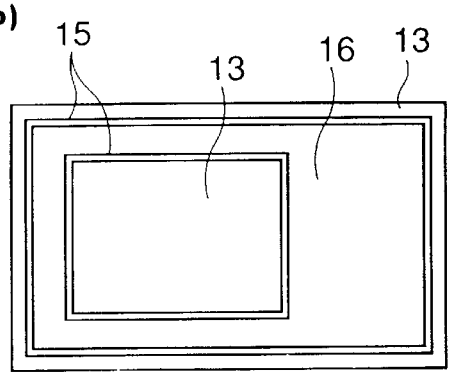
Figure 6:
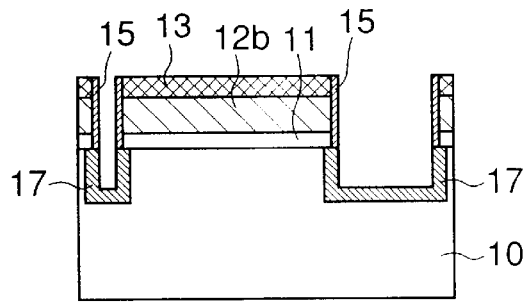
Figure 6:
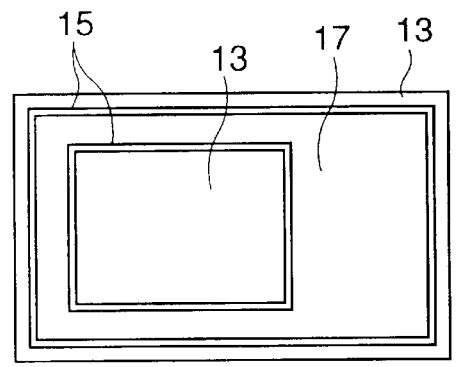
Figure 7:
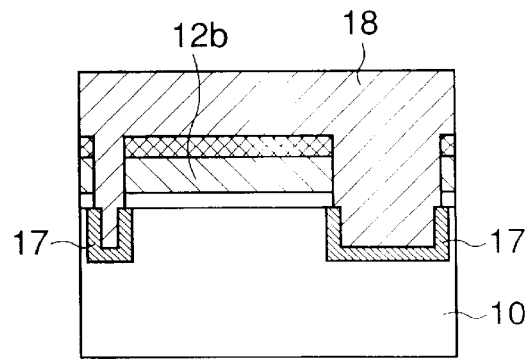
Figure 7:
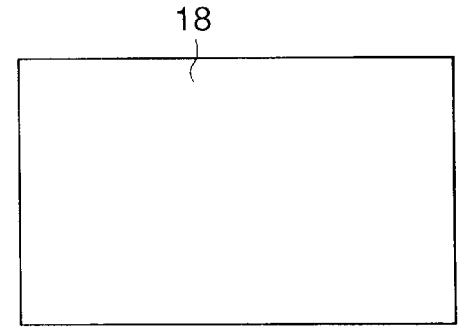
Figure 8:
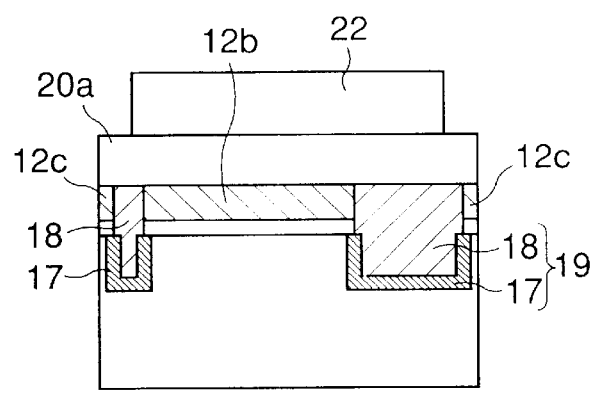
Figure 8:
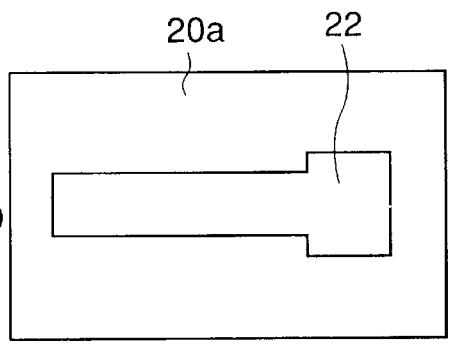
Figure 9:
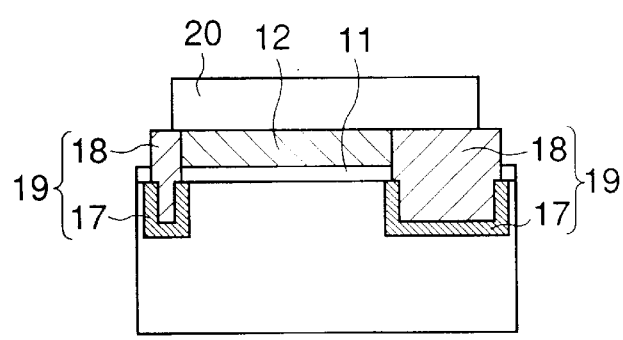
Figure 9:
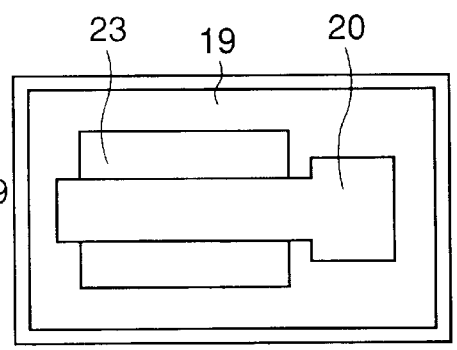

The semiconductor transistor of the present invention is formed in a device formation region between trench device isolation regions and mainly comprises a gate insulating film, a gate electrode, source/drain regions and a gate electrode wiring.

The trench device isolation region according to the present invention is mainly constituted of an oxide film formed on the walls of a trench which is formed in a semiconductor substrate, and an insulating film buried in the trench. The size and depth of the trench formed in the semiconductor substrate may suitably be adjusted according to the characteristics of the intended semiconductor structure. The oxide film formed on the walls of the trench may be about 5 to about 50 nm thickness, for example. The insulating film buried in the trench is not particularly limited and may be of an oxide film such as an HDP film, an HTO film and a plasma oxide film or a nitride film. The insulating film is preferably formed not only to fill the trench but also to be piled up so as to take the same surface as the gate electrode without any level difference.

The gate electrode is formed on the gate insulating film overlaying the device formation region and extends over the trench device isolation regions. The gate electrode is arranged to cross the device formation region and overlaps the trench device isolation regions with a length smaller than a length corresponding to the thickness of the oxide film formed on the walls of the trench. The gate insulating film may be formed of a silicon oxide film, a silicon nitride film or the like into a thickness of about 2 to about 10 nm, for example. The gate electrode may be formed in a thickness of about 50 to about 200 nm of a conductive film of: polysilicon doped with impurities; a metal such as aluminum, platinum, gold, silver, copper or the like; a refractory metal such as tantalum, titanium, tungsten or the like; silicide; and polyside, for example. Among these, polysilicon is preferred. Particularly, in the present invention, the gate insulating film has a uniform thickness regardless where it is formed. Further, the distance from an interface between the gate electrode and the gate insulating film to the surface of the device formation region is determined as the same as the distance from the above-described interface to the trench device isolation region.

The gate electrode wiring may be formed of a material selected from those mentioned for the gate electrode. The thickness thereof is not particularly limited, and may be suitably adjusted according to the performance of the intended semiconductor transistor, a voltage to be applied and the like. The gate electrode wiring is formed on the device formation region in self-alignment with the gate electrode to have the same length as the gate electrode. In this case, the length of the gate electrode is not particularly limited, but may be about 0.1 to about 50 μm, for example.

The source/drain regions can be formed by the introduction of the p-type or n-type impurity in the surface of the semiconductor substrate through suitably selecting a known method such as ion implantation for manufacturing semiconductor devices. The source/drain regions may be formed as LDD, DDD, asymmetric LDD or DDD structure. The concentration of the impurity in the source/drain regions is not particularly limited, but may be adjusted as appropriate depending upon desired performances of the transistor.

In the process of manufacturing the semiconductor transistor according to the present invention, in the step (i), a gate insulating film, a first conductive film, a first oxide film and a resist pattern for forming a trench device isolation region are formed on a semiconductor substrate. Examples of the semiconductor substrate used herein include an element semiconductor such as silicon, germanium or the like, a compound semiconductor such as GaAs, ZnSe or the like. Among these, a substrate of silicon is preferred. The gate insulating film, the first conductive film and the first oxide film may be formed of a material suitably selected from the above-mentioned materials by a known technique such as CVD, vacuum evaporation or EB method. The resist pattern may be formed to have an opening in a desired region by a known technique, for example, photolithography and etching method.

In the step (ii), using the resist pattern as a mask, the first oxide film, the first conductive film and the gate insulating film are etched. The etching may be performed by wet etching method utilizing an alkali solution or dry etching method. Thus, the first oxide film, the first conductive film and the gate insulating film formed on the trench device isolation region are removed to form an opening in a region corresponding to the trench device isolation region.

In the step, (iii), an oxidization protective film is formed on the sides of the first oxide film, the first conductive film and the gate insulating film. The oxidization protective film used herein is a film for preventing oxidization and may be formed of a silicon nitride film or the like, for example. The oxidization protective film is provided by forming a silicon nitride film on the entire surface of the first oxide film including the trench device isolation region and anisotropically etching-back the silicon nitride film such as RIE method until the surface of the first oxide film is exposed. The thickness of the silicon nitride film may suitably be adjusted according to the size and depth of the trench, for example, about 5 to about 15 nm.

In the step (iv), a trench is formed in the semiconductor substrate using the first oxide film and the oxidization protective film as a mask. The trench can be formed by anisotropically etching such as RIE method. After the formation of the trench, the inside walls of the trench are oxidized to form a second oxide film on the entire wall (inclusive the bottom) surface of the trench so as to eliminate or reduce damages generated in the semiconductor substrate in the formation of the trench. The oxidization is performed by a thermal treatment at a temperature of about 800 to about 1050° C. in an atmosphere of oxygen gas for about 3 to about 60 minutes, thereby to form the second oxide film of about 5 to about 50 nm thick. At this time, the sides of the gate insulating film, the first conductive film and the first oxide film are not oxidized because the oxidization protective film covers them. After these steps, the oxidization protective film is removed by a known technique, for example, by dipping into phosphoric acid.

In the step (v), an insulating film is formed on the entire surface of the semiconductor substrate including the trench. The insulating film formed here is an insulating film for filling the trench and may be formed of an oxide film such as an HDP film, an HTO film and a plasma oxide film or a nitride film, for example. Among these, an oxide film is preferred. The thickness of the insulating film is preferably greater than the depth of the trench, more preferably greater than the sum of the depth of the trench and the thicknesses of the gate insulating film and the first conductive film.

In the step (vi), the insulating film and the second oxide film are removed until the first conductive film is exposed. The removal may be performed by wet etching, dry etching or CMP method. Among these, CMP method is preferable. Thus, the insulating film is buried in the trench and the first oxide film overlaid on the first conductive film is removed. Accordingly, the surfaces of the buried insulating film in the trench device isolation region and the first conductive film can be flattened without any level difference.

In the step (vii), a second conductive film and a resist pattern for forming a gate electrode/a gate electrode wiring are formed on the first conductive film. The second conductive film is formed in the same manner as for the first conductive film. The resist pattern is formed in the same manner as for the resist pattern in the step (i).

In the step (viii), the first and second conductive films are patterned sequentially using the resist pattern as a mask. Thus, on the device formation region, the gate electrode wiring is formed in self-alignment with the gate electrode to have the same length as the gate length of the gate electrode.

In the process, for manufacturing the semiconductor transistor according to the present invention, an ion implantation for forming a low concentration and/or a high concentration impurity layer (e.g., a source/drain region, etc.) is preferably performed before, during or after a desired process. The ion implantation may be performed to form the impurity layers at both sides of the gate electrode symmetrically or asymmetrically. Further, an interlayer insulating film, a contact hole, a contact plug, a wiring layer and the like are formed in combination in optional steps before, after or between the above steps as required.

Hereinafter, an example of the process of manufacturing the semiconductor transistor according to the present invention will be explained with reference to the drawings.

As shown in FIGS. 1(a) and 1(b), the semiconductor transistor of the present invention is formed on a device formation region 23 defined by trench device isolation regions 19 which are formed in a silicon substrate 10.

A gate electrode 12 is formed on a gate insulating film 11 overlaying the device formation region 23 and extends over the trench device isolation regions 19.

The trench device isolation region 19 comprises an oxide film 17 formed on the walls of the trench and an HDP film 18 filling the trench. The HDP film 18 is piled up to such a thickness that the surfaces of the trench device isolation region 19 and the gate electrode 12 have the same flat surface.

A gate electrode wiring 20 is formed and connected in self-alignment on the gate electrode 12 and extends over the HDP films 18 in the trench device isolation regions 19. The gate electrode wiring 20 is formed to have the same length as the length of the gate electrode 12 (L in FIG. 1(a)) on the device formation region 23.

As shown in FIG. 1(c), the above-described construction makes the distance X (from an inter-face between the gate electrode 12/the gate insulating film 11 to the surface of the device formation region 23) the same as the distance Y (from the above-described interface to the surface of the oxide film 17 constituting the trench device isolation region 19). Thus, a gate bird's beak is not generated and a narrow channel effect is prevented.

The gate insulating film 11 is uniform in thickness at every portion and will not be thinned regardless where it is formed, which ensures the gate insulating film of high reliability.

The gate electrode 12 completely covers the device formation region 23, that is, a channel region, therefore no reversal region caused by the gate electrode wiring 20 is generated. In addition, the gate electrode wiring 20 is formed on the gate electrode 12 and the trench device isolation region 19 having flat surfaces, so that no steep configuration is formed. Therefore, the gate electrode wiring 20 and a wiring layer overlaid thereon will be formed more precisely.

The above-mentioned semiconductor transistor can be formed by the following steps. In FIGS. 2 to 9, FIGS. (a) show sectional views taken along the line A—A' in FIG. 1(a) and FIGS. (b) show plan views.

First, on a silicon substrate 10, a gate insulating film 11 of about 5 nm thick and a first conductive film of a phosphorus doped polysilicon film 12a of about 200 nm thick are formed. In this step, a uniform and highly reliable gate insulating film can be obtained since the gate insulating film 11 is formed on the flat silicon substrate 10. Next, a silicon oxide film 13 of about 100 nm thick is formed as a mask for a trench formation and a resist pattern 14 having an opening in a trench device isolation region is formed thereon as shown in FIGS. 2(a) and 2(b).

Then, as shown in FIGS. 3(a) and 3(b), the silicon oxide film 13, the polysilicon film 12a and the gate insulating film 11 are etched using the resist pattern 14 as a mask. At this time, a gate electrode 12b is formed simultaneously.

After removing the resist pattern 14, as shown in FIGS. 4(a) and 4(b), a silicon nitride film of about 10 nm thick is formed on the entire surface of the silicon substrate 10 and etched back to form an oxidization protective film 15 on the sides of the gate insulating film 11, the gate electrode 12b and the silicon oxide film 13.

Then, as shown in FIGS. 5(a) and 5(b), the silicon substrate 10 is etched using the silicon oxide film 13 and the oxidization protective film 15 as masks. Thus, a trench 16 for the trench device isolation region is formed to have a depth of about 400 nm.

Next, as shown in FIGS. 6(a) and 6(b), the surface of silicon in the trench 16 is oxidized to form an oxide film 17 of about 35 nm thick. The thus formed oxide film 17 serves as a part of a device isolation region. The oxidization protective film 15 covers an edge portion of the gate electrode 12b. The film 15 prevents this portion from being oxidized and maintains the configuration of the portion. Thus, the silicon substrate 10 below the gate electrode 12b is oxidized and the gate electrode 12b is formed in self-alignment on the device formation region and extends over the trench device isolation regions.

After removing the oxidization protective film 15, an HDP film 18 of about 800 nm thick is formed on the entire surface of the resulting silicon substrate 10 to fill the trench 16 as shown in FIGS. 7(a) and 7(b).

Then, the HDP film 18 and the silicon oxide film 13 are removed by CMP method until the surface of the gate electrode 12b is exposed. Thus, a trench device isolation region 19 is formed. A polysilicon film 12c which does not constitute the gate electrode 12b serves as a dummy so that it forms highly planarized surface.

Then, as shown in FIGS. 8(a) and 8(b), a phosphorus doped polysilicon film 20a is deposited as a second conductive film to a thickness of about 200 nm on the trench device isolation region 19 and the gate electrode 12b. As viewed in section, the phosphorus doped polysilicon film 20a has a very smooth surface since the underlying film is flat. Further, a contact is formed in self-alignment since the polysilicon film 20a is formed directly on the gate electrode 12b. Next, a resist pattern 22 is formed for providing a gate electrode wiring 20. The resist pattern 22 can be formed much precisely since the underlying film is flat.

Then, as shown in FIGS. 9(a) and 9(b), the polysilicon 20a and the gate electrode 12b are sequentially etched using the resist pattern 22 as a mask, thereby to form the gate electrode wiring 20 and the gate electrode 12 in self-alignment on the device formation region and remove the polysilicon film 12c having served as a dummy.

Thereafter, implantation and diffusion of impurities, formation of interlayer insulating films, metal wirings are performed to complete the semiconductor transistor.

According to the present invention, the gate electrode is formed on the device formation region with the intervention of the gate insulating film and extends over the trench device isolation regions, and the distance from an interface between the gate electrode and the gate insulating film to the surface of the device isolation region and the distance from the above-described interface to the trench device isolation region are the same. Therefore, a region such as gate bird's beak is not generated, which prevents a narrow channel effect. Further, this construction enables the formation of the gate insulating film uniform in thickness in every portion, which prevents the gate insulating film from being thinned depending where it is formed. Thus, a highly reliable gate insulating film is ensured.

Further, the gate electrode completely covers the device formation region, which prevents the formation of reversal regions caused by the gate electrode wiring. Thus, a semiconductor transistor with less variation in the characteristics can be provided.

The gate electrode can be formed with improved preciseness where the gate electrode and the trench device isolation region have the same flat surface without any level difference.

Still further, according to the process of manufacturing the semiconductor transistor of the present invention, a simple step of forming the oxidization protective film on the sides of the oxide film, the first conductive film and the gate insulating film can eliminate damages generated in the semiconductor substrate during the formation of the trench and prevent the gate insulating film from being thickened, i.e., the gate bird's beak. Thus, a semiconductor transistor of high reliability as described above can be manufactured.

What is claimed is:

1. A semiconductor transistor formed between trench device isolation regions comprising:

a gate insulating film formed on a semiconductor substrate, a gate electrode formed on a device formation region of the semiconductor substrate with the intervention of the gate insulating film and the gate electrode extending over a portion of each of the trench device isolation regions and wherein a top surface of the gate electrode is at the same level as top surfaces of each of the trench isolation regions, a distance from an interface between the gate electrode and the gate insulating film to a surface of the device formation region and a distance from said interface to the trench device isolation region being the same; and a gate electrode wiring formed in self-alignment with the gate electrode to have the same length as a length of the gate electrode and connected on the gate electrode on the device formation region.

2. A semiconductor transistor according to claim 1, wherein the trench device isolation region is constituted of an oxide film formed on a wall of a trench which is formed in the semiconductor substrate, and an insulating film buried in the trench.

3. A semiconductor transistor according to claim 2, wherein the gate electrode overlaps the trench device isolation region with a length smaller than a length corresponding to the thickness of the oxide film formed on the wall of the trench.

4. A semiconductor device comprising:

first and second trench device isolation regions formed in a semiconductor substrate, each of the trench device isolation regions including an oxide film on a trench sidewall thereof;

a transistor formed at least partially between the first and second trench device isolation regions, the transistor comprising:

a gate insulating film formed on the semiconductor substrate, and a gate electrode formed on a device formation region of the semiconductor substrate over the gate insulating film, wherein the gate electrode extends over only a portion of, but not all of, at least one of the oxide films of a corresponding one of the trench device isolation regions, and wherein a distance from an interface between the gate electrode and the gate insulating film to a surface of the device formation region and a distance from said interface to the trench device isolation region is the same; and wherein a top surface of the gate electrode is at the same level as top surfaces of each of the trench isolation regions.

* * * * *